(12) United States Patent
Oberai et al.

(10) Patent No.: US 11,561,256 B2
(45) Date of Patent: Jan. 24, 2023

(54) CORRELATION BETWEEN EMISSION SPOTS UTILIZING CAD DATA IN COMBINATION WITH EMISSION MICROSCOPE IMAGES

(71) Applicant: Synopsys, Inc., Mountain View, CA (US)

(72) Inventors: Ankush Bharati Oberai, Fremont, CA (US); Rupa Sunil Kamoji, Mumbai (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/135,240

(22) Filed: Dec. 28, 2020

(65) Prior Publication Data

US 2021/0199714 A1    Jul. 1, 2021

Related U.S. Application Data

(60) Provisional application No. 62/955,652, filed on Dec. 31, 2019.

(51) Int. Cl.
*H01J 37/285* (2006.01)
*G01R 31/311* (2006.01)
*G01N 23/2255* (2018.01)

(52) U.S. Cl.
CPC ....... *G01R 31/311* (2013.01); *G01N 23/2255* (2013.01); *H01J 37/285* (2013.01); *H01J 2237/2812* (2013.01)

(58) Field of Classification Search
CPC . G01N 23/2255; G01R 31/311; G06F 30/398; H01J 37/285; H01J 2237/2812; H01L 22/14

(Continued)

(56) References Cited

U.S. PATENT DOCUMENTS

2005/0062490 A1    3/2005  Polonsky et al.
2007/0118827 A1    5/2007  Rahman
(Continued)

FOREIGN PATENT DOCUMENTS

JP    2003086689 A    3/2003
TW    201351305 A    12/2013
TW    201723899 A    7/2017

OTHER PUBLICATIONS

PCT/US2020/067706—International Search Report and Written Opinion dated Apr. 13, 2021, 14 pages.
(Continued)

*Primary Examiner* — Jermele M Hollington
*Assistant Examiner* — Courtney G Mcdonnough
(74) *Attorney, Agent, or Firm* — Haynes Beffel & Wolfeld LLP; Andrew L. Dunlap

(57) ABSTRACT

A method includes capturing a photon emission microscope (PEM) image of an integrated circuit (IC), and identifying emission sites in the PEM image, where the emission sites are associated with a leakage current. A set of common nets is found that connects multiple emission sites using layout data and/or netlist data in computer-aided design (CAD) data. From the layout data and/or netlist data, a critical net is identified from the set of common nets connecting a threshold number of emission sites. The critical net is cross-mapped, by a processor, tip netlist data in the CAD data. A particular device is identified from the netlist data that has an output pin connected to the critical net. The particular device identified from the netlist data is cross-mapped, by a processor, to the layout data, wherein the critical net connects at least two devices at the identified emission sites including the particular device.

20 Claims, 15 Drawing Sheets
(5 of 15 Drawing Sheet(s) Filed in Color)

(58) Field of Classification Search
USPC .................................................. 324/754.01
See application file for complete search history.

(56) References Cited

U.S. PATENT DOCUMENTS

2007/0179731 A1* 8/2007 Suri ..................... G01R 31/311
                                                    702/117
2007/0290696 A1* 12/2007 Majima ................ G01R 31/303
                                                    324/762.01
2013/0211749 A1    8/2013 Chu et al.

OTHER PUBLICATIONS

TW 109147157—First Office Action dated Dec. 6, 2021 with English Translation, 23 pages.
Auvray et al., Evolution of navigation and simulation tools in failure analysis, ResearchGate, dated Sep. 2016, 9 pages.

* cited by examiner

CORRELATION BETWEEN EMISSION SPOTS UTILIZING CAD DATA IN COMBINATION WITH EMISSION MICROSCOPE IMAGES

CROSS REFERENCE TO OTHER APPLICATIONS

This application claims the benefit of U.S. Provisional Application No. 62/955,652, filed Dec. 31, 2019, titled "Correlation between Emission Spots Utilizing CAD Data in Combination with Emission Microscope Images," by Ankush Bharati Oberai, Rupa Sunil Kamoji, which is incorporated by reference herein in its entirety.

TECHNICAL FIELD

The present disclosure relates to failure analysis of manufactured integrated circuits.

BACKGROUND

As technology nodes are shrinking, there is an increased and critical need for improved approaches for analyzing integrated circuit (IC) failures. The technology node refers to a specific semiconductor manufacturing process and its design rules. Different technology nodes often imply different circuit generations and architectures. Generally, the smaller the technology node, the smaller the feature size, requiring smaller transistors which are both faster and more power-efficient. For example, 7 nanometer (nm) lithography process is a technology node semiconductor manufacturing process following the 10 nm process node. Failure analysis approaches need to have surgical-like accuracy due to the smaller feature size of transistors within the ICs. For example, failure analysis can be done using Emission Microscope Images (EMMI) that are generated by a Photon Emission Microscope (PEM) for detecting leakage current resulting from device defects, e.g., gate oxide defects/leakage, latch-up, electric static discharge (ESD) failure, junction leakage, etc.

Specifically, EMMI (also referred to as emission microscopy) is an optical analysis technique used to detect and localize certain IC failures. Emission microscopy is non-invasive and can be performed from either the front or back of devices. Many device defects induce faint light emission in the visible and near infrared (IR) spectrum. This emitted light is captured as emission spots/hotspots on the image of the IC captured using EMMI. EMMI is conducted using a photon emission microscope to obtain the image. Typically, the image will have a series of photon emission spots initiated by one or more physical defects. However, by just looking at emissions, it is not possible to distinguish between the emission caused by the device defects and secondary emissions caused by an actual transistor failure on the IC.

In recent IC designs, there can be more than 7-8 transmission gates in between the two photon emission spots which connect them. With a resolution of about 0.5 micrometer ($\mu m$) in a photon emission microscope (PEM) system and transistor dimensions less than 1 $\mu m$, it is not possible to link a photon emission spot to exactly one transistor. It is desired, for any fault isolation method, to correlate these emission spots via common nets connecting these emission spots.

SUMMARY

A method is provided for finding correlations between emission sites identified using a photon emission microscope on an integrated circuit and computer-aided design (CAD) data. A photon emission microscope (PEM) image is captured of an integrated circuit (IC). Emission sites in the PEM image are identified, where the emission sites are associated with a leakage current. A set of common nets is found that connects multiple emission sites using layout data and/or netlist data in the CAD data. From the layout data and/or netlist data, a critical net is identified from the set of common nets that connects a threshold number of emission sites. In one embodiment, the threshold number of emission sites is the greatest number of emission sites among the set of common nets. The critical net identified from the layout data is cross-mapped, by a processor, to netlist data in the CAD data. From the netlist data, a particular device is identified that has an output pin connected to the critical net. The particular device identified from the netlist data is cross-mapped, by a processor, to the layout data. The critical net connects at least two devices at the identified emission sites including the particular device.

The finding of the common nets can comprise finding nets overlapping each emission site, finding devices connected to each of the found nets, and adding the found devices to a list of connected devices. Input pins or output pins of a device in the list of connected devices can be identified, nets connected to the identified input pins or output pins can be identified, and additional devices connected to an identified net can be found. Whether a number of devices connected to the identified net is below a limit can be determined. In response to determining that the number of devices connected to the identified net is below the limit, whether any of the additional devices connected to the identified net is in the list of connected devices can be determined. In response to determining that the additional devices connected to the identified net is in the list of connected devices, the identified net can be added to a list of valid nets and be classified as a common net.

The cross-mapping of the critical net to netlist data in the CAD data, and the cross-mapping of the particular device to the layout data can use layout versus schematics data in the CAD data.

The identifying of the particular device can include searching the netlist data in the CAD data in a forward direction from an input to an output of devices, or in a backward direction from an output to an input of devices.

A first device, of the at least two devices at the identified emission sites, can have a defect causing a light emission on the PEM image, a second device, of the at least two devices at the identified emission sites, may emit light on the PEM image as a result of the defect in the first device, and the identified particular device is the first device.

The at least two devices at the identified emission sites can be connected through a direct wire connection. The at least two devices at the identified emission sites can be connected through one or more levels of transmission gates.

The method can further include selecting emission sites identified in the layout data, finding devices overlapping the emission sites using the netlist data; and finding interconnecting paths between the devices overlapping the emission sites.

The method can further include selecting a pair of elements in the netlist data, the pair of elements being cross-mapped from emission sites in the layout data, a first element in the pair being one of a first device and a first net, a second element in the pair being one of a second device and a second net; and finding an interconnecting path between the elements in the pair.

The method can further include selecting an interconnecting path between devices overlapping emission sites in a first graphic viewer using one of the layout data and the netlist data in the CAD data; and cross-mapping the interconnecting path to a second graphic viewer using another of the layout data and the netlist data in the CAD data.

A system and non-transitory computer readable medium are also provided for finding correlations between emission sites identified using a photon emission microscope (PEM) on an integrated circuit (IC) and computer-aided design (CAD) data corresponding to the IC, as described herein.

As used herein, a schematic viewer can display the schematics data produced from the netlist data, including devices such as a transistor, a transmission gate, a full adder, a half adder, and gates (e.g. AND, NAND, OR, NOR) and interconnections between the devices. A layout viewer can display layout data including geometric representations of circuit components such as transistors or capacitors and routing such as connection of the circuit components by multiple conductors. A mask viewer can display lithography masks that are used to produce finished integrated circuits.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The color drawings also may be available in PAIR via the Supplemental Content tab.

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
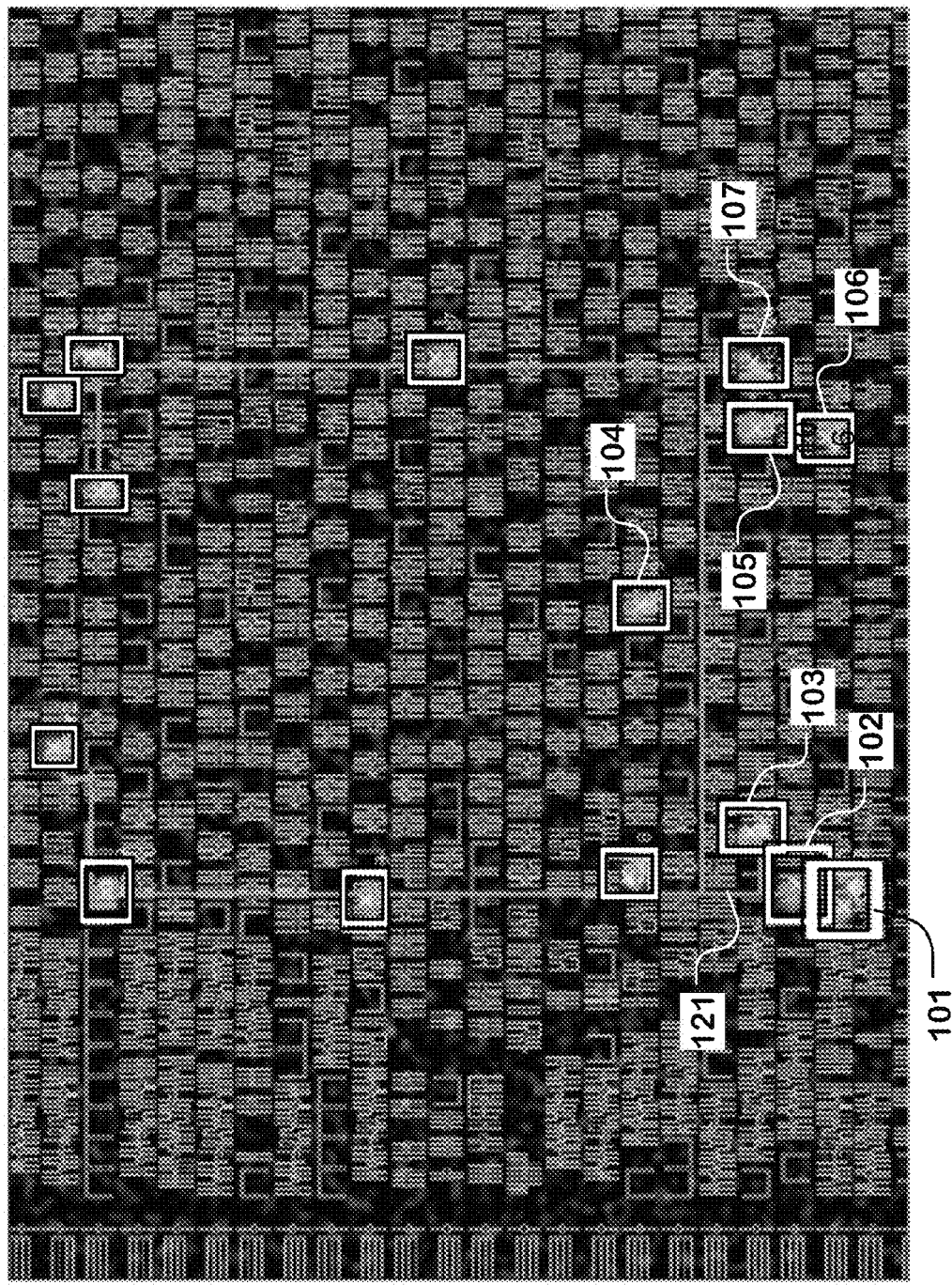
FIG. 1 illustrates example emission sites on layout data of an IC design in a layout viewer using a PEM image in accordance with some embodiments.

Aspects of the present disclosure relate to a method for finding correlations between emission sites identified using a photon emission microscope (PEM) on an integrated circuit and computer-aided design (CAD) data. A photon emission microscope generates emission microscope images (EMMI) including emission sites for failure analysis of semiconductor components. The emission microscope images (EMMI) can also be referred to as PEM images. A photon emission microscope uses a highly-sensitive charge couple device (CCD) capable of detecting photons emitted when the electron/electric-hole pair reunites in the device. Emission sites refer to locations on EMMI where the emitted photons are detected and can also be referred to as PEM sites. For example, the emitted photons can be a faint light of a wavelength between 350 nm and 1100 nm. EMMI can be used extensively for detecting leakage current resulting from device defects, e.g., gate oxide defects/leakage, latch-up, electric static discharge (ESD) failure, junction leakage, etc. However, in recent IC designs having smaller and smaller components, a first emission site having a physical defect which causes an original photon emission can be connected to a second emission site via more than 7-8 transmission gates.

Sometimes, the failure of one transistor on the IC will make it appear as if other transistors have failed as well, even when they are not actually failed transistors. With methods of analysis that can identify a net connecting a number of emission spots, it is not possible to find out which emission site has one transistor that has a physical defect that causes photon emissions at other emission sites. There is a great need to be able to distinguish between the transistor or transistors that have actually failed and the transistor or transistors that appear to have failed only as a result of the transistor that has actually failed.

Methods can identify a net having direct connections to transistors beneath emission spots, referred to as a common net. In an IC, a net or a common net can include one or more metal or polysilicon conductors. Those methods can be useful to localize the failing devices which have emitted light due to direct defect on the device such as certain open or short circuits of metal or polysilicon interconnections. However, devices can also be connected via transmission gates, and some methods of fault localization are not able to correlate multiple emissions spots and identify faulty devices especially when the devices beneath emission spots are connected via transmission gates. Therefore, these above-described methods that identify the devices beneath the photon emission spots reported by light emission and laser emission techniques are not sufficient for accurately identifying faulty transistors in nanoscale technology nodes.

The technology disclosed uses a database for an integrated circuit (IC) design. The database is generated using IC design data including netlist data, layout data and layout vs schematic (LVS) data. The layout data corresponds to the layout of the IC. Based on the location of the emission sites on the layout of the IC, a critical net can be found in the layout data, and cross-mapped to the schematic data. A critical net refers to a net that connects a threshold number of emission sites. For instance, a set of common nets of the IC can be found that connect multiple emission sites using layout data and/or netlist data in the CAD data, the set of common nets can be sorted in order of the number of emission sites connected to each common net, and a critical net can be identified that connects a greater number of emission sites than any other common nets in the set of common nets. In the schematic data, a driver device on the critical net can be found and cross-mapped back to the layout data, to locate a faulty device, e.g. a transistor, that causes photon emissions at the faulty device and at other emission sites connected to the critical net.

As represented by the CAD data, an IC design includes devices connected by nets via input pins and output pins of the devices. A device having an output pin connected to a net is referred to as a driver device on the net. For instance, a driver device can be a transistor, a gate (AND, NAND, OR, NOR, XOR, NOR), a flipflop, etc. A device having an input pin connected to a net is referred to as a receiver device on the net. A device can be a driver device for a first net, and a receiver device for second net, depending on how the nets are connected to the device.

Advantages of the present disclosure include, but are not limited to, identifying devices beneath emission sites reported by light emission and laser emission techniques, and identifying connectivity between the devices which are connected directly through wires or indirectly through transmission gates. The technology disclosed can help a failure analysis engineer to focus on the most critical nets and/or devices connected to emission sites for faster fault localization and failure analysis. The technology disclosed can be applied for analog, digital and/or mixed signal integrated circuits.

FIG. 1 illustrates example emission sites from a PEM image on layout data of an IC design in a layout viewer using a PEM image in accordance with some embodiments. In this example, multiple emission sites (e.g. 101-107) from a PEM image of an IC are selected in the layout data of an IC design, where the multiple emission sites are connected to a net 121. A faulty device can be at one of the multiple emission sites, and can cause photon emissions at the faulty device and at other emission sites connected to the net 121. In the layout data of an IC design, a net can be implemented as one or more connections and interconnections using conductive materials. Correlating these emission sites detected by photon emission microscope technology, which indicates potentially faulty transistors of the integrated circuit, can be used for failure analysis of the IC.

A set of common nets of the IC can be found that connect multiple emission sites. The common nets in the set can be sorted in order of the number of emission sites connected to each common net. A critical net 121 can be determined as a common net that is connected to a greater number of emission sites than any other common nets in the set of common nets.

Figure 2:
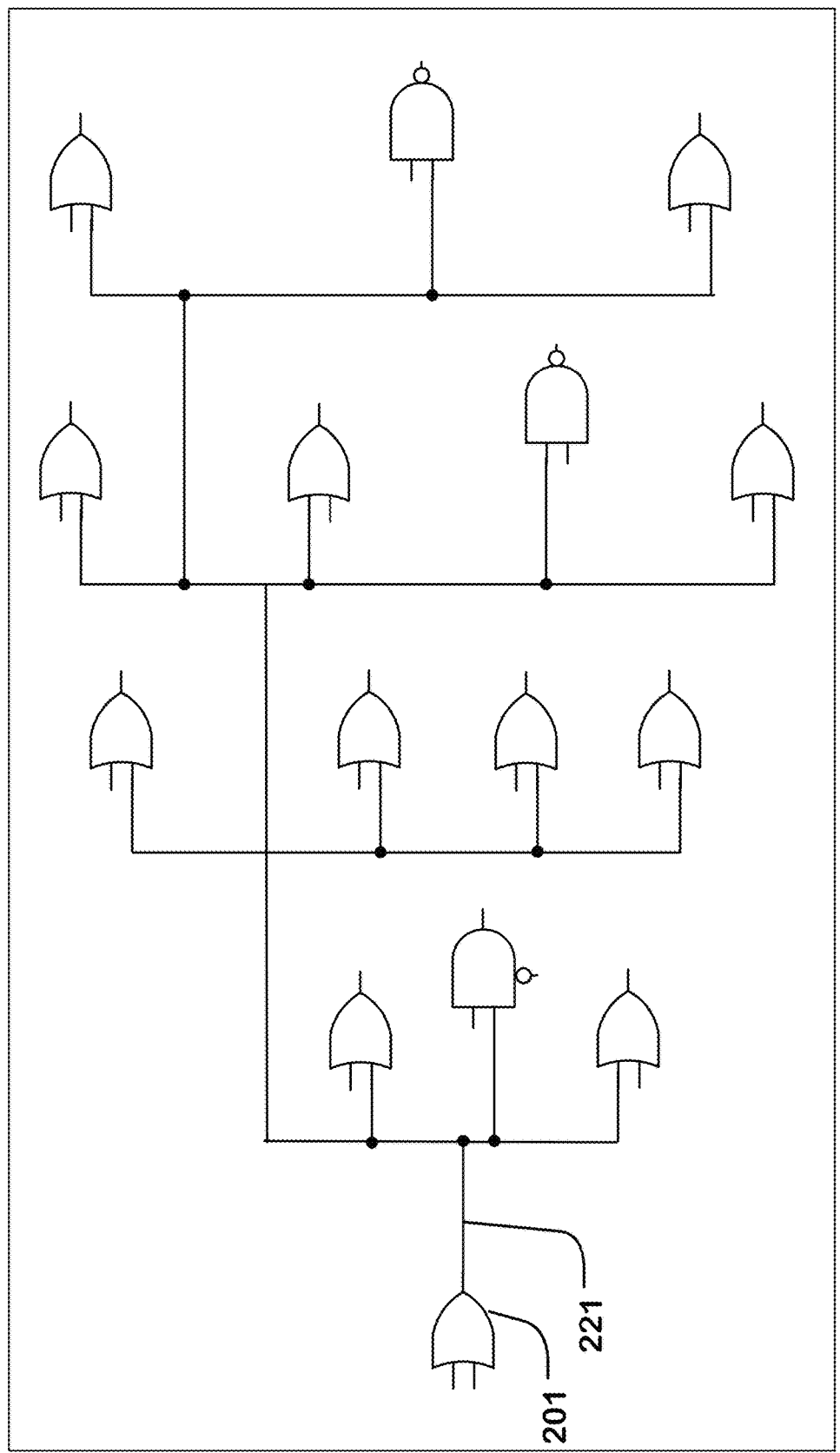
FIG. 2 illustrates example schematic data in a simplified schematic viewer, the schematic data corresponding to the layout data shown in FIG. 1, in accordance with some embodiments.

FIG. 2 illustrates example schematic data in a simplified schematic viewer, the schematic data corresponding to the layout data shown in FIG. 1, in accordance with some embodiments. The critical net 121 found in the layout data (FIG. 1) can be cross-mapped to the schematic data as shown in a schematic viewer 200, using layout versus schematics data. In this example, an OR gate 201 is found as a driver device of the critical net 121, and is cross-mapped back to an emission site 101 in the layout data using layout versus schematics data, for performing physical failure analysis of the IC.

As used herein, cross-mapping a net or a device refers to identify a net or a device represented in a first data type with a corresponding device or a corresponding net represented in a second data type, where first and second data types include layout, netlist, schematic, and layout versus schematics data in the CAD data. The schematic data is a logical representation of an IC design, and can be viewed in a schematic viewer. The layout data is a physical representation of an IC design, and can be viewed in a layout viewer. Cross-mapping helps to identify the same net or the same device in these two representations of the same IC design.

For instance, cross-mapping a net represented in the schematic data to the layout data refers to identify a logical net in a schematic viewer using the schematic data and a corresponding net in a layout viewer using the layout data. A corresponding net in a layout viewer can be represented by multiple polygons, and can be highlighted by highlighting those polygons representing the net.

For instance, cross-mapping a net represented in the layout data to the schematic data refers to identify a net by selecting one of the polygons representing the net in a layout viewer, and highlighting the corresponding net in a schematic viewer using the schematic data.

Figure 3:
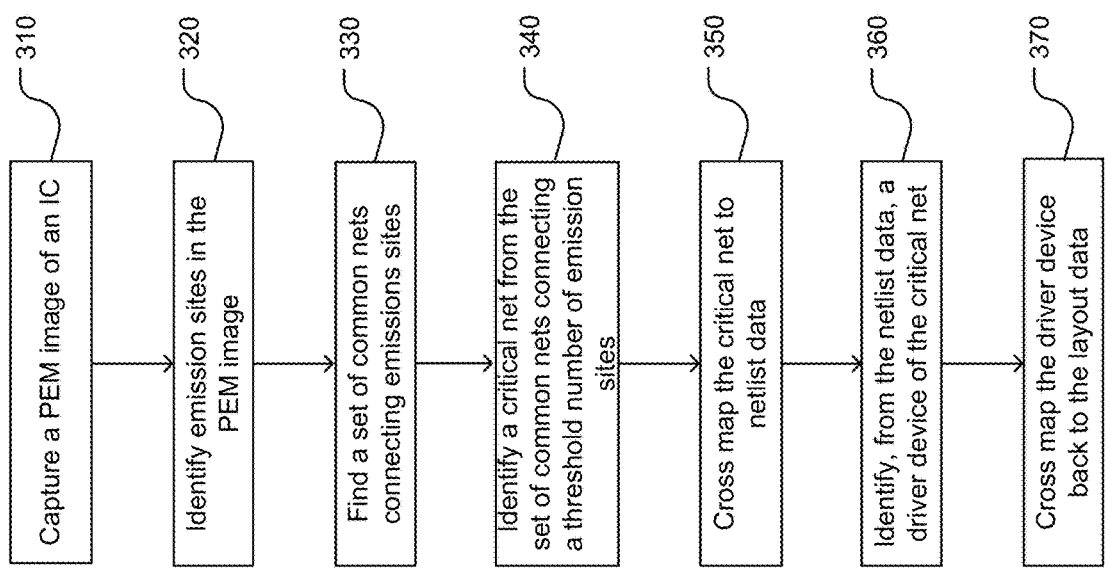
FIG. 3 illustrates a flowchart for finding correlations between emission sites identified using a photon emission microscope on an integrated circuit (IC) and computer-aided design (CAD) data corresponding to the IC in accordance with some embodiments.

FIG. 3 illustrates a flowchart for finding correlations between emission sites identified using a photon emission microscope (PEM) on an integrated circuit (IC) and computer-aided design (CAD) data corresponding to the IC in accordance with some embodiments.

A photon emission microscope uses a type of electron microscopy that utilizes local variations in electron emissions originating from a layer of material to generate image contrast in a PEM image. A physical fault analysis (PFA) area can be narrowed down to a few micrometers in a PEM image. When an IC under test has leakage current due to some physical anomaly, the leakage current can be observed by a PEM in the gate area of the IC. The gate area is in the polysilicon layer, so the emission sites are visible in the polysilicon layer.

At Step 310, a photon emission microscope (PEM) image of a manufactured integrated circuit (IC) is captured. For an IC under test by a PEM, only the polysilicon layer is selected for capturing photon emissions, i.e., photon emissions can only originate from the polysilicon layer. At Step 320, emission sites in the PEM image can be identified in the layout data of the IC as shown in a layout viewer (FIG. 1), where the emission sites are associated with a leakage current and the PEM image of the IC corresponds to the layout data of the IC.

At Step 330, a set of common nets of the IC is found that connect multiple emission sites using layout data and/or netlist data in the CAD data. If the LVS data is available, then the LVS data can be used to find a set of common nets.

If the LVS data is not available, then the layout data can be used. Extracting common nets is further described in reference to FIG. 6.

At Step 340, from the layout data and/or netlist data, a critical net can be identified from the set of common nets that connects a threshold number of emission sites. In one embodiment, the threshold number of emission sites is the greatest number of emission sites among the set of common nets. For instance, a set of extracted common nets can be sorted in order of the number of emission sites connected to each common net. A critical net can be identified that connects the greatest number of emission sites among the set of common nets. In other words, a critical net can be identified that connects a greater number of emission sites than any other common nets in the set of common nets, or connects a maximum number of emission sites among the set of common nets.

At Step 350, the critical net identified from the layout data can be cross-mapped, by a processor, to netlist data in the CAD data, as shown in a schematic viewer (FIG. 2), using layout versus schematics data.

At Step 360, from the netlist data, a particular device having an output pin connected to the critical net can be identified. The particular device can be referred to as a driver device of the critical net. Following the nets and devices via their input pins and output pins connected to the nets, an IC design can be traced to find a driver device having an output pin connected to the critical net. The critical net can connect at least two devices at the identified emission sites including the particular device.

At Step 370, the particular device identified from the netlist data for the critical net can be cross-mapped, by a processor, back to the layout data using layout versus schematics data, to limit a physical fault analysis (PFA) area for performing the physical failure analysis (PFA) on the critical net and the emission sites connected to the net. For instance, a driver device 201 in the schematic data (FIG. 2), as an example of the particular device, can be cross-mapped to an emission site 101 in the layout data (FIG. 1).

The critical net connects at least two devices at the identified emission sites, where the particular device can be one of the at least two devices. The at least two devices at the identified emission sites can be connected through a direct wire connection, or through one or more levels of transmission gates, or through one or more levels of buffers and/or inverters. A first device, of the at least two devices at the identified emission sites, can have a defect causing a light emission on the PEM image, a second device, in the at least two devices at the identified emission sites, can emit light as a result of the defect in the first device. The identified particular device is the first device of the at least two devices at the identified emission sites.

Figure 4:
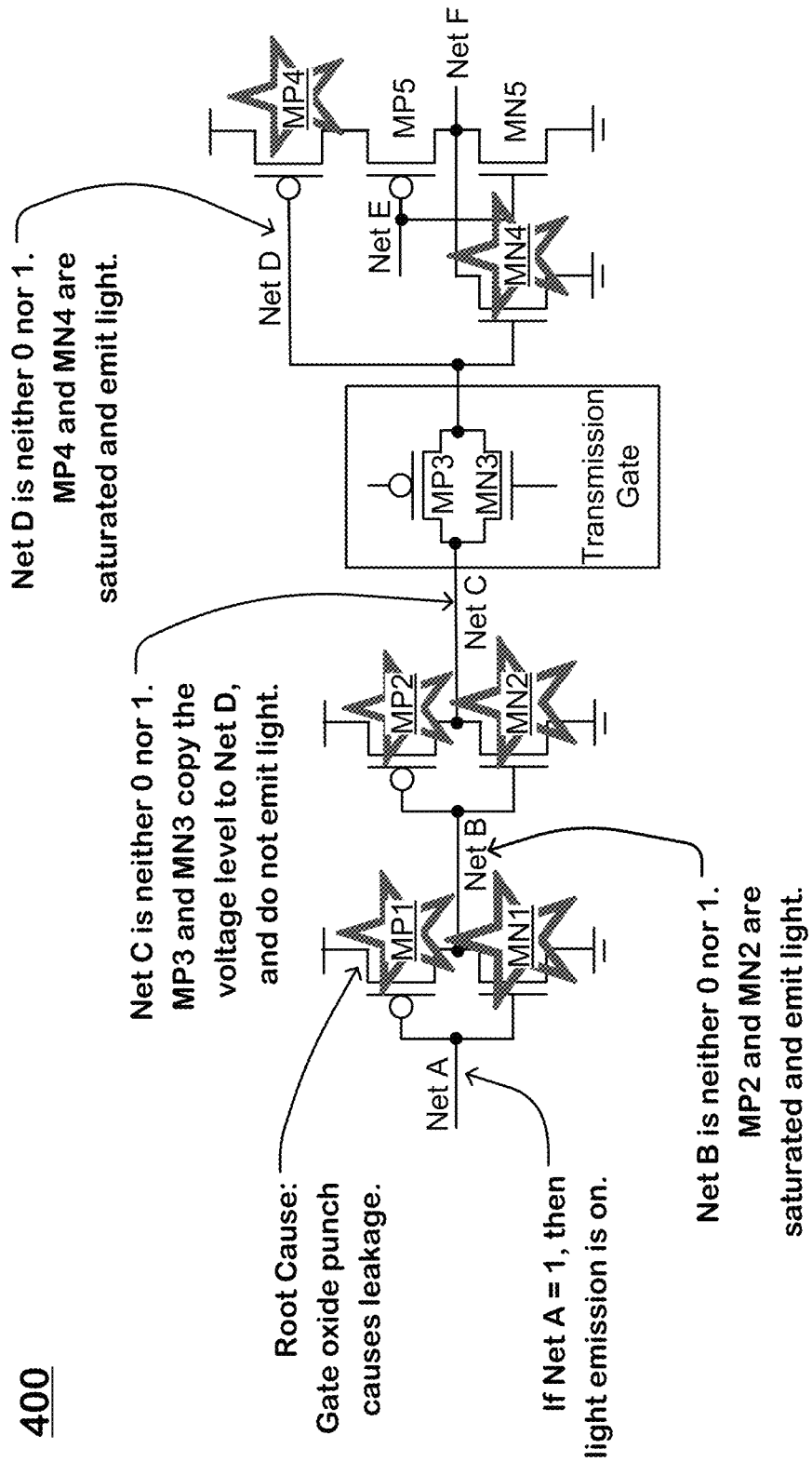
FIG. 4 illustrates an example circuit schematic which shows multiple emissions sites identified by an EMMI generated by a PEM in accordance with some embodiments.

FIG. 4 illustrates an example circuit schematic 400 which shows multiple emission sites identified by an EMMI generated by a PEM in accordance with some embodiments. In the schematic, STARs mark the multiple emission sites. Multiple emission sites can be due to multiple devices being saturated from a single defect on a transistor MP1. In this example, the root cause for the multiple emission sites is gate oxide punch that causes leakage at the transistor MP1. Net A is connected to gates of transistors MP1 and MN1. When Net A is at logic high (=1), light emission is on at the transistors MP1 and MN1, as indicated by STARs.

Net B is connected to the outputs of transistors MP1 and MN1 and connected to gates of transistors MP2 and MN2. Because of the leakage at transistor MP1, Net B is at neither logic high (=1) nor logic low (=0), and transistors MP2 and MN2 are saturated and emit light, as indicated by STARs. In this example, NET B has two driver devices MP1 and MN1. When searching for a driver device that is the root cause, the technology disclosed can present both driver devices of a net for exploration by a failure analysis engineer.

Net C is connected to the output of transistors MP2 and MN2 and connected to the input of a transmission gate formed of transistors MP3 and MN3. Because Net B is at neither logic high (=1) nor logic low (=0), Net C is at neither logic high (=1) nor logic low (=0), and transistors MP3 and MN3 in the transmission gate copy the voltage level at Net C to Net D.

Net D is connected to the output of the transmission gate and connected to the gates of transistors MP4 and MN4. Because the voltage level at Net C is copied to Net D, Net D is also at neither logic high (=1) nor logic low (=0). Consequently, transistors MP4 and MN4 are saturated and emit light, as indicated by STARs.

Figure 5:
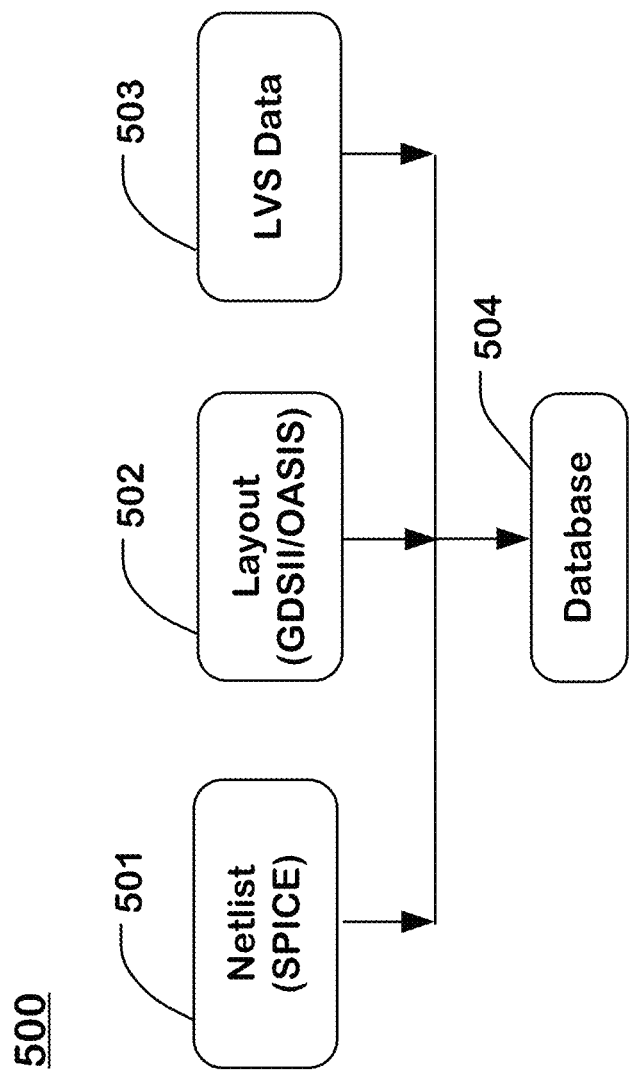
FIG. 5 illustrates computer-aided design (CAD) data used for connectivity analysis in accordance with some embodiments.
Figure 6:
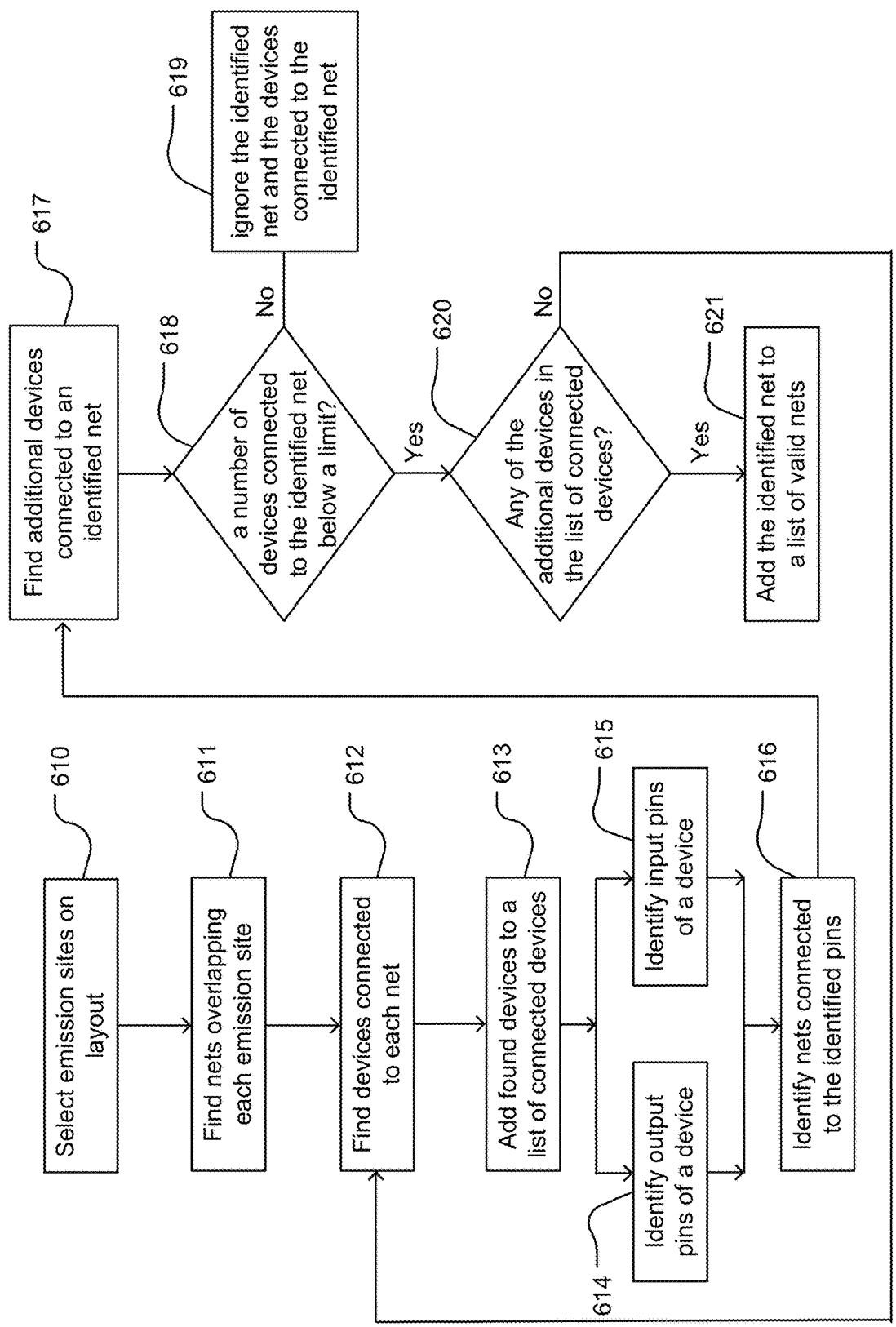
FIG. 6 illustrates a flowchart for a process that extracts common nets connecting emission sites in an integrated circuit (IC) using computer-aided design (CAD) data in accordance with some embodiments.

A process, as described in reference to FIG. 6, can extract common nets (Nets A, B, C, D) and transmission gates (MP3, MN3) connecting all emission sites (MP1, MN1, MP2, MN2, MN4, MP4) using the layout data in the computer-aided design (CAD) data. CAD data is further described in reference to FIG. 5. Emission sites may be connected by direct wire connections (Nets B, C, D) or through single or multi-level transmission gates (MP3, MN3). Based on this extracted schematic and representation of the connections on physical layout, the failure analysis engineer can quickly pinpoint the most probable and plausible emission site closest to the physical defect for faster fault localization.

FIG. 5 illustrates computer-aided design (CAD) data used for connectivity analysis in accordance with some embodiments. Various data types in the CAD data are used to correlate the emission sites to the physical locations of the IC design and to identify the devices under the emission sites. The CAD data is converted to a database format for optimized storage and efficient region-based search. The CAD data can include netlist data 501, layout data 502, and layout versus schematics data 503.

Netlist data 501 in the CAD data can include devices such as transistors, buffers, inverters, and gates (e.g. AND, NAND, OR, NOR XOR, XNONR), and connections between the devices. Netlist data can be used to find the connections across various devices and extract the schematics of all connected devices. Layout data 502 in the CAD data can include geometric representations of the device and connections in the netlist data. Layout versus schematics (LVS) data 503 in the CAD data can include correspondence between devices and connections in the layout data and devices and connections in the netlist data.

Figure 11:
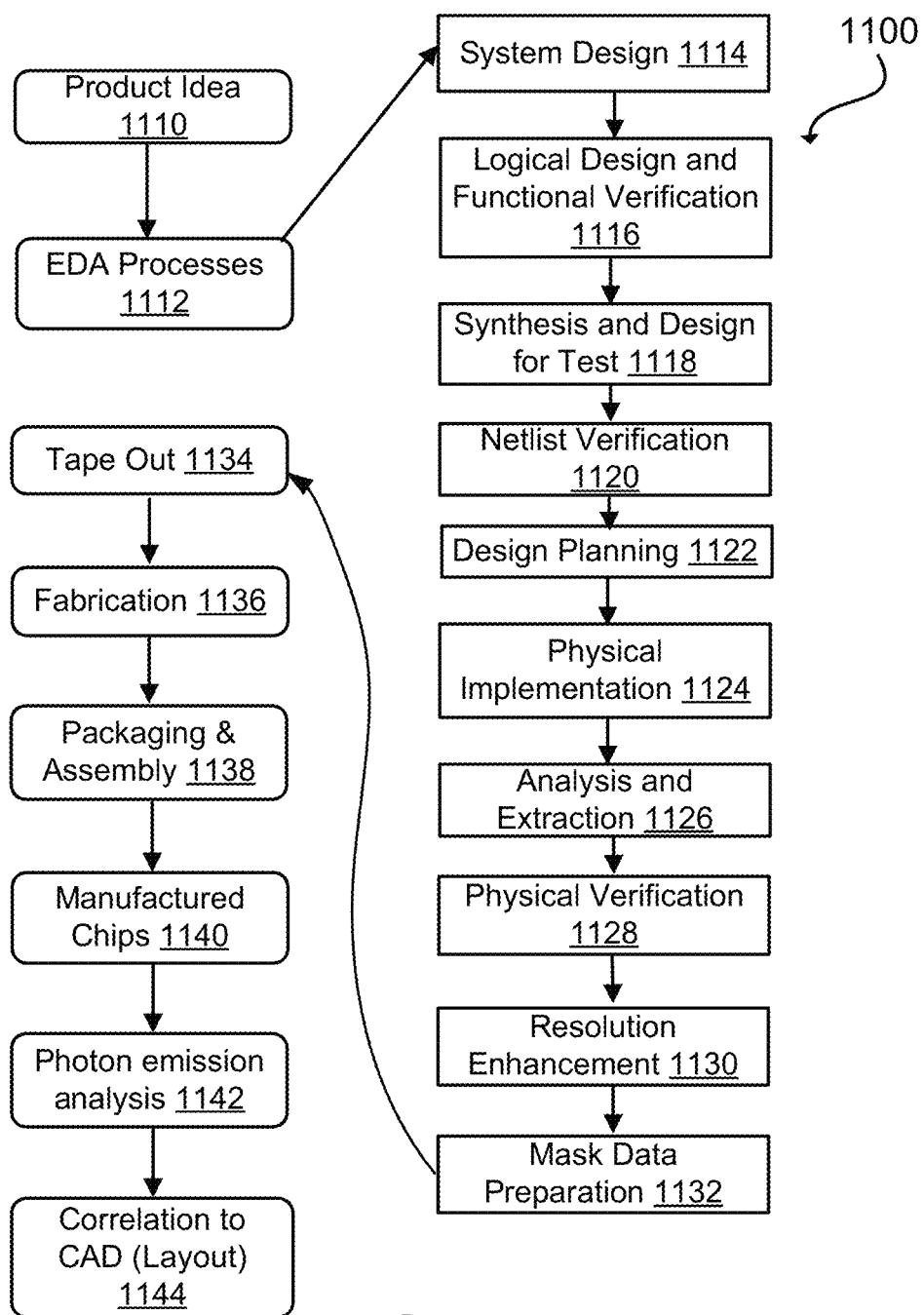
FIG. 11 depicts a flowchart of various processes used during the design and manufacture of an integrated circuit in accordance with some embodiments of the present disclosure.

As shown in an example set of processes in FIG. 11, netlist data can be produced by the process 1118 for synthesis, and layout data can be produced by the process 1124 for physical implementation. Schematics data can be produced from the netlist data, and include devices such as a transistor, a transmission gate, and gates (e.g. AND, NAND, OR, NOR) and connections between the devices. Layout versus schematics (LVS) data can be produced as a result of comparing the layout data and the schematics data.

FIG. 6 illustrates a flowchart for a process that extracts common nets connecting emission sites in an integrated circuit (IC) using the computer-aided design (CAD) data in accordance with some embodiments. As represented in the CAD data, devices in an IC design have input and output pins which are connected to nets. A device can have one or more input pins and one or more output pins, and can be connected to one or more nets through the input and output pins. A net can connect multiple devices through input and output pins of the multiple devices. Multiple nets can overlap one emission site.

For instance, the process can be implemented using graphs to construct the devices and nets in an IC design. A graph includes nodes and edges connecting the nodes. Nets in the CAD data can be represented as nodes in a graph, and devices in the CAD data having connections to the nets can be represented as edges in a graph. Searching of nets and devices can be done by traversing edges and nodes in a graph that represents the CAD data of an IC design.

At Step 610, emission sites from a PEM image of an IC can be selected in the layout data of the IC as shown in a layout viewer (FIG. 1), where the PEM image of the IC corresponds to the layout data of the IC.

At Step 611, nets overlapping each emission site can be found using the layout data for the IC design.

At Step 612, all devices connected to each net can be found using the layout data for the IC design. For instance, a device can be found by following a net through an input pin or output pin connected to the net and the device.

At Step 613, the devices found at Step 612 can be added to a list of connected devices. The devices added to the list of connected devices are further explored until a device is found that is already in the list of connected devices, as further described in the following steps.

At Step 614, the layout data for the IC design can be searched in a forward direction from an input pin to an output pin of devices in order to identify output pins of a device in the list of connected devices. For instance, the output pins of a device can be the source and drain pins of a transistor.

At Step 615, the layout data for the IC design can be searched in a backward direction from an output pin to an input pin of devices in order to identify input pins of a device in the list of connected devices. For instance, the input pins of a device can be the gate of a transistor.

At Step 616, nets can be identified that are connected to the input pins and/or output pins identified at Steps and/or 615.

At Step 617, additional devices can be found that are connected to an identified net that is identified at Step 616.

At Step 618, it is determined whether a number of devices connected to the identified net is below a limit, e.g. 512. If no, the identified net is a global net, and at Step 619, the identified net and the devices connected to the identified net are ignored for purposes of extracting nets connecting devices under emission sites. In response to determining that the number of devices connected to the identified net is below the limit, at Step 620, it is determined whether any of the additional devices connected to the identified net, as found at Step 617, is already in the list of connected devices. If no, the flow continues to Step 612.

In response to determining that the additional devices connected to the identified net is in the list of connected devices, at Step 621, the identified net is added to a list of valid nets, and classified as a common net for purposes of extracting common nets connecting devices under emission sites.

Figure 7A:
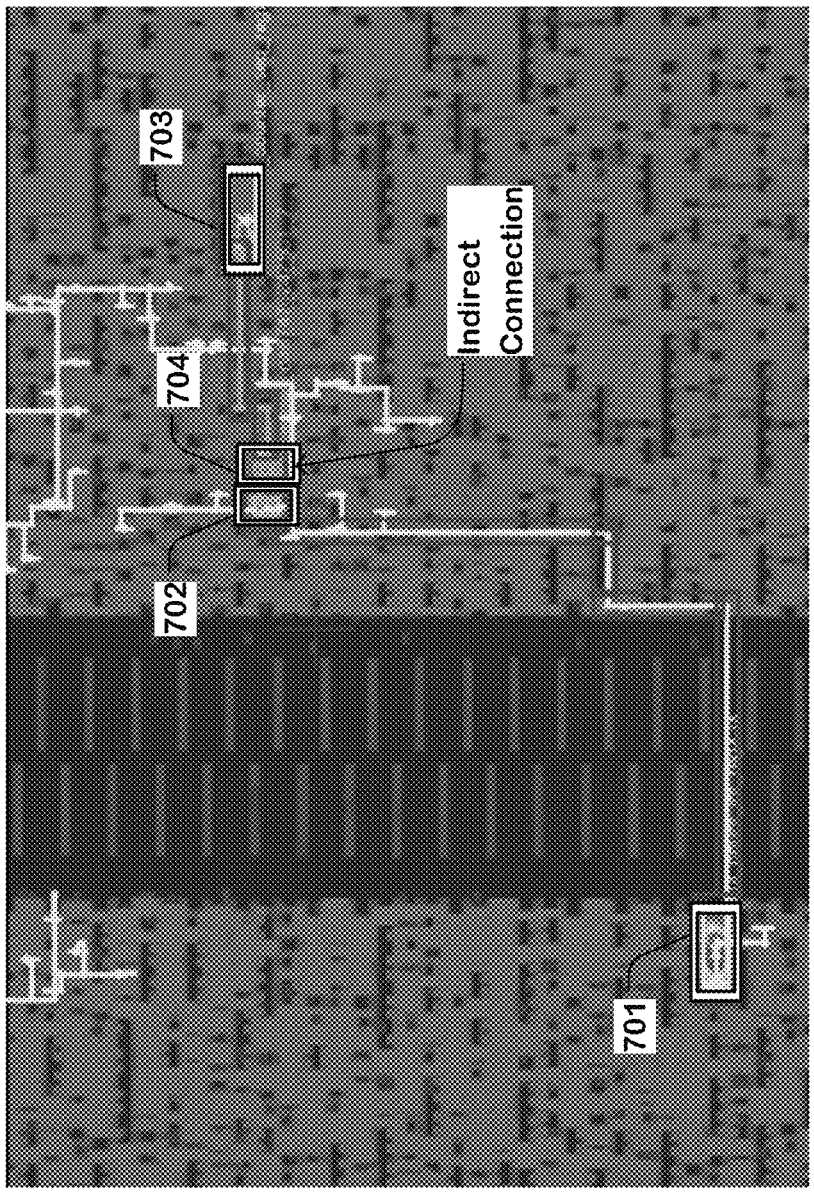
FIGS. 7A and 7B illustrate an example case that correlates the emission sites with the devices beneath the emission sites, where the emission sites are connected through direct and indirect connections in accordance with some embodiments.
Figure 7B:
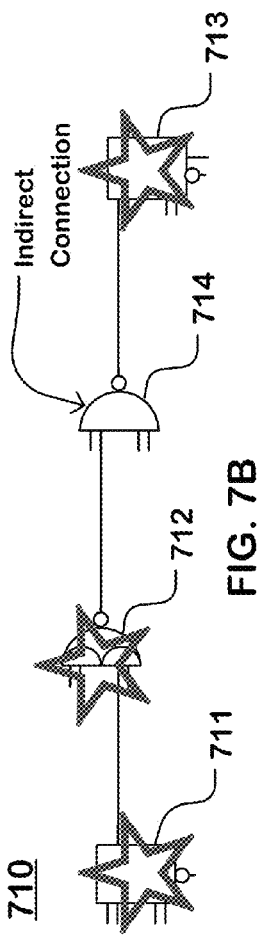

FIGS. 7A and 7B illustrate an example case that correlates the emission sites with the devices beneath the emission sites, where the emission sites are connected through direct and indirect connections in accordance with some embodiments. Direct connections refer to a net implemented as one or more connections and interconnections using conductive materials. Indirect connections refer to devices not overlapping emission sites but are connected between emission sites. FIG. 7A illustrates a layout viewer 700 showing emission sites (701, 702, 703) marked in the layout. FIG. 7B illustrates a schematic viewer 710 showing devices corresponding to the emission sites in FIG. 7A, where STARs mark the emission sites. The image overlaid on the layout has three emission sites 701, 702 and 703 (FIG. 7A). The schematic viewer (FIG. 7B) shows three devices 711, 712 and 713 corresponding to the three emission sites in FIG. 7A. The schematic is analyzed for the device connections, and an indirect connection 714 is found, corresponding to an indirect connection 704 shown in the layout viewer 700. Here an indirect connection 714 is a device that does not overlap an emission site, but is connected between two devices (712, 713, FIG. 7B) overlapping emission sites (702, 703, FIG. 7A).

This technique can identify the devices beneath the emission sites reported by photon emission and laser emission techniques by finding correlations between emission sites identified using a photon emission microscope on an integrated circuit and computer-aided design (CAD) data. This technique can also identify the connectivity between these devices which are connected directly through nets or indirectly through one or more levels of transmission gates, or through one or more levels of buffers and/or inverters. Mapping layout to schematic and extraction of logical connectivity make the PEM technique more powerful.

This technique can help the failure analysis engineer focus on the most critical nets and devices for faster fault localization and failure analysis. Using this method, a failure analysis engineer can perform a failure analysis task in about 30 minutes to 1 hour, while in comparison, a similar failure analysis task would take a few months using other methods.

This technique can be applied to analog, digital or mixed signal products.

Figure 8A:
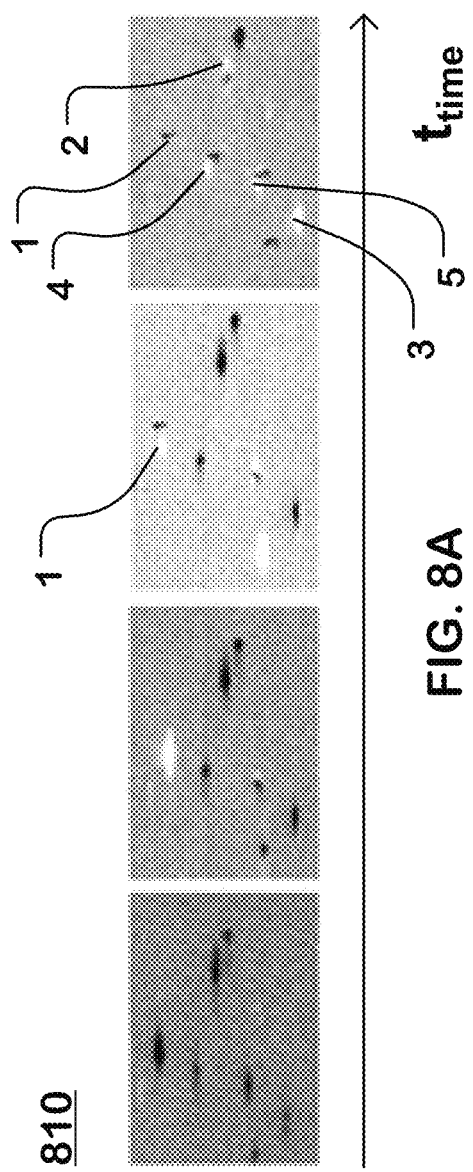
FIGS. 8A, 8B and 8C illustrate an example case identifying the emission sites on an integrated circuit through Laser Assisted Device Alteration (LADA) using Laser Scanning Microscopy (LSM) in accordance with some embodiments.
Figure 8B:
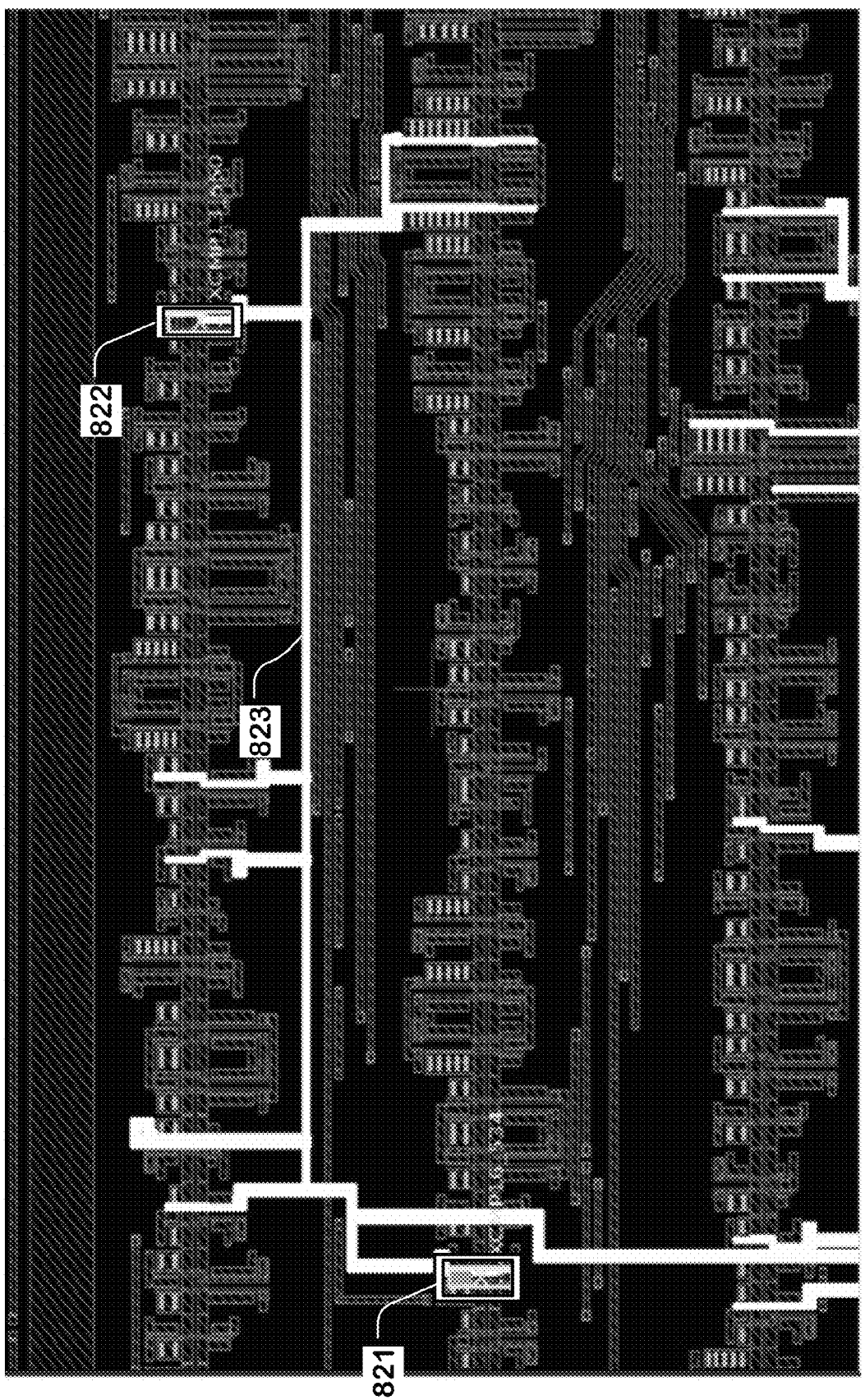
Figure 8C:
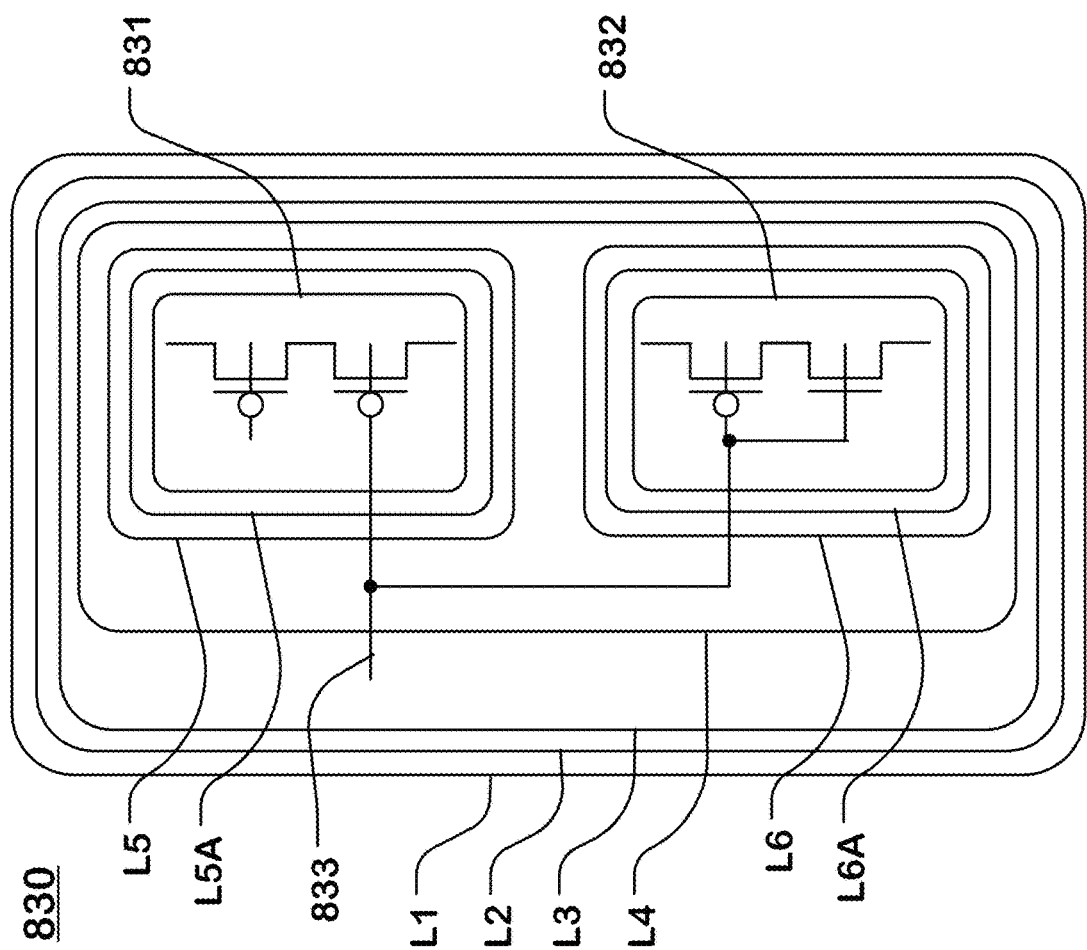

FIGS. 8A, 8B and 8C illustrate an example case identifying the emission sites on an integrated circuit through Laser Assisted Device Alteration (LADA) using Laser Scanning Microscopy (LSM) in accordance with some embodiments. LSM is an optical imaging technique for increasing optical resolution and contrast of a micrograph by means of using a spatial pinhole to block out-of-focus light in image formation. LSM can be used to collect images of IC devices emitting light due to leakage. Marginal failure is common in failure analysis in which the failure is dependent on voltage or timing. FIG. 8A illustrates an example series of emission images 810 of an integrated circuit from dynamic LADA technique at different times. Instead of using die top micro probing to isolate a failure location, Laser Assisted Device Alteration (LADA) together with modified test pattern can be used to isolate the failure location. Depending on the wavelength used by the laser for LADA, the laser can induce current or heat and thereby alter the device characteristics temporarily. The identified device characteristics can help the failure analysis engineer in debugging circuits on the semiconductor device. Numbers 1, 2, 3, 4 and 5 in the images are the sequence in which the emission sites are captured using LSM, and can be used by the failure analysis engineer to isolate a failure location among multiple emission sites.

FIG. 8B illustrates a layout view 820 showing emission sites 821 and 822 from using the LADA technique at different times overlaid on multiple devices beneath. A critical path 823 connecting the multiple devices is also shown.

FIG. 8C illustrates a schematic viewer 830 showing a top level design L1 including a hierarchy of logical designs. The hierarchy of logical designs in L1 includes a lower level design L2 which includes a lower level design L3 which includes a lower level design L4. L4 includes a lower level design L5 and a lower level design L6. L5 includes a lower level design L5A, and L6 includes a lower level design L6A. Device 831 within design L5A and device 832 within design L6A are identified beneath the emission sites 821 and 822 in FIG. 8B. Devices 831 and 832 are connected through a critical path 833 in the schematic viewer corresponding to the critical path 823 in the layout view as shown in FIG. 8B. Identifying the interconnectivity of the devices beneath the multiple emission sites through nets or transmission gates is further described in reference to FIG. 6.

Figure 9A:
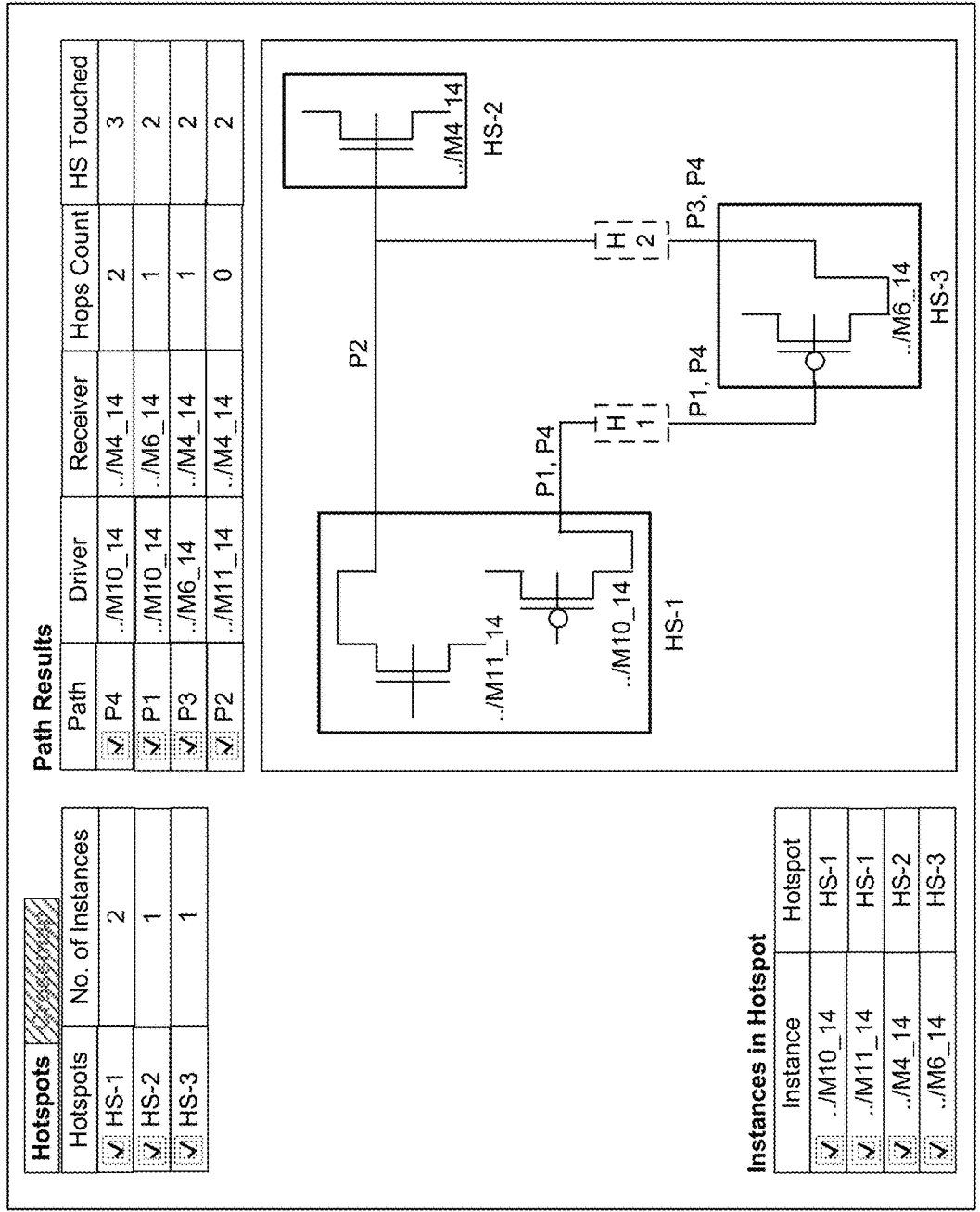
FIGS. 9A and 9B illustrate an example graphic user interface (GUI) for selecting an input for the process to find interconnecting paths between emission sites and also showing the found interconnecting paths in accordance with some embodiments.
Figure 9B:
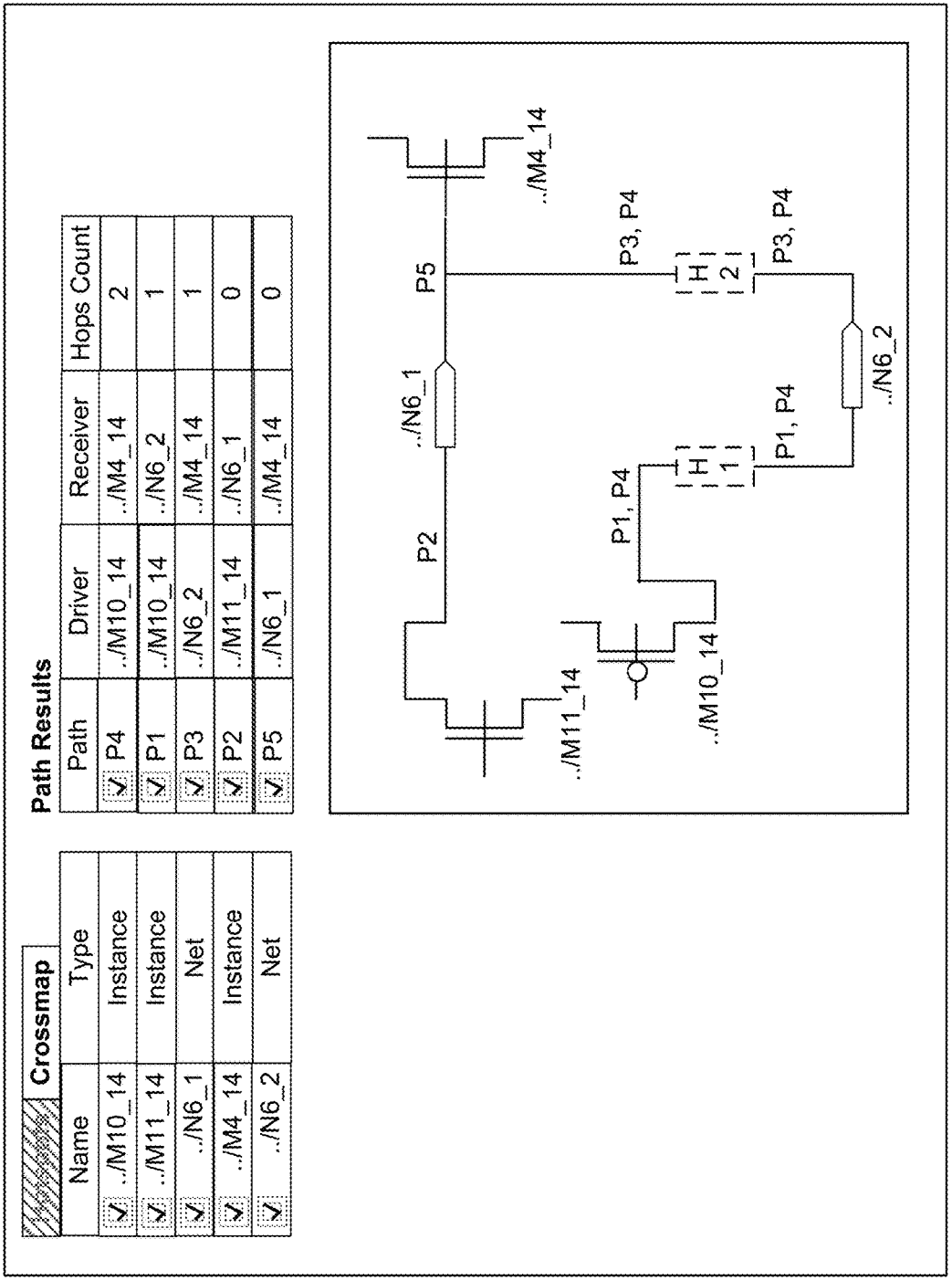

FIGS. 9A and 9B illustrate an example graphic user interface (GUI) 900 for selecting an input for the process to find interconnecting paths between emission sites and also showing the found interconnecting paths in accordance with some embodiments. The GUI has two flows. In a first flow, interconnecting paths between emission sites can be found by selecting emission sites identified in the layout data. In a second flow, interconnecting paths between emission sites can be found by selecting a pair of elements in the netlist data, where the pair of elements have been cross-mapped from emission sites in the layout data. A first element in the pair is one of a first device and a first net, and a second element in the pair is one of a second device and a second net. In the GUI, emission sites are referred to as hotspots.

A schematic like diagram at the lower-right corner of the GUI displays devices at hotspots connected to each other via different paths. The paths connecting the devices may have direct connections such as conductors or wires, or may have indirect connections. Indirect connections are also referred to as hops. As used herein, hops can include transmission gates, inverters and buffers.

FIG. 9A illustrates the first flow in the GUI for finding interconnecting paths by selecting emission sites identified in the layout data. In the first flow, emission sites or hotspots identified in the layout data are selected, devices overlapping the emission sites are found using the netlist data, and interconnecting paths are found between the devices overlapping the emission sites. The interconnecting paths and the devices overlapping the emission sites can be displayed in the GUI.

At the upper-left corner of the GUI, the first flow "Hotspots" is selected, while the second flow "Crossmap" is crossed out, indicating the second flow is not selected.

In a "Hotspots" table at the upper-left corner of the GUI for the first flow, hotspots selected in the layout data by a user are listed, along with the number of instances of devices (e.g. transistors) in each hotspot. For instance, a first hotspot HS-1 has two instances in it, a second hotspot HS-2 has 1 instance in it, and a third hotspot HS-3 has 1 instance in it. The GUI provides functions to edit hotspots, where the functions can include adding, deleting, clearing and filtering hotspots. Hotspots can be filtered using checkboxes. The edited hotspots can be saved to and loaded from files on a computer.

In a "Instances in Hotspot" table at the lower-left corner of the GUI, leaf level instances present in the selected hotspots are listed. The CAD data of an IC design can include a hierarchy of devices starting at a top level and ending at leaf level instances. Some instances in the hierarchy may have lower level devices below them. Leaf level instances have no more lower levels below them. In this example, two devices ../M10_14 and ../M11_14 are in the first hotspot HS-1, a device ../M4_14 is in the second hotspot HS-2, and a device ../M6_14 is in the third hotspot HS-3. Devices can be filtered using checkboxes. This table can be dynamically updated when hotspots are added, deleted, cleared and filtered.

In a "Path Results" table at the upper-right corner of the GUI, paths between a driver device and a receiver device are listed, along with a count of hops through a path and the number of hotspots touched by a path. A path can start at a source device, end at a destination device, and include hops between the source device and destination device. For instance, a first path P1 is between a driver device ../M10_14 and a receiver device ../M6_14, has one hop H1, and touches two hotspots HS-1 and HS-3. A second path P2 is between a driver device ../M11_14 and a receiver device ../M4_14, has no hops, and touches two hotspots HS-1 and HS-2. A third path P3 is between a driver device ../M6_14 and a receiver device ../M4_14, has one hop H2, and touches two hotspots HS-2 and HS-3. A fourth path P4 is between a driver device ../M10_14 and a receiver device ../M4_14, has two hops H1 and H2, and touches two hotspots HS-1 and HS-3.

FIG. 9B illustrates the second flow in the GUI for finding interconnecting paths between emission sites by selecting a pair of elements in the netlist data, where the pair of elements have been cross-mapped from emission sites in the layout data. A first element in the pair is one of a first device and a first net, a second element in the pair is one of a second device and a second net. An interconnecting path between the elements in the pair can be found in the netlist data. The interconnecting path and the elements in the pair can be displayed in the GUI.

At the upper-left corner of the GUI, the first flow "Hotspots" is crossed out, indicating the first flow is not selected, while the second flow "Crossmap" is selected.

In a "Crossmap" table at the upper-left corner of the GUI for the second flow, devices "../M10_14", "../M11_14", and "../M4_14" are selected. Also selected are nets "../N6_1" and "../N6_2". Devices and nets in a "Crossmap" table can be filtered using checkboxes. The selected and filtered devices and nets can be saved to and loaded from files on a computer.

In a "Path Results" table at the upper-right corner of the GUI, paths between a driver device and a receiver device are listed, along with a count of hops through a path. A path can start at a source device, end at a destination device, and include hops between the source device and destination device. For instance, a first path P1 is between a driver device ../M10_14 and a net ../N6_2, and has one hop H1. A second path P2 is between a driver device ../M11_14 and a net ../N6_1 and has no hops. A third path P3 is between a net ../N6_2 and a receiver device ../M4_14 and has one hop H2. A fourth path P4 is between a driver device ../M10_14 and a receiver device ../M4_14 and has two hops H1 and H2.

Figure 10A:
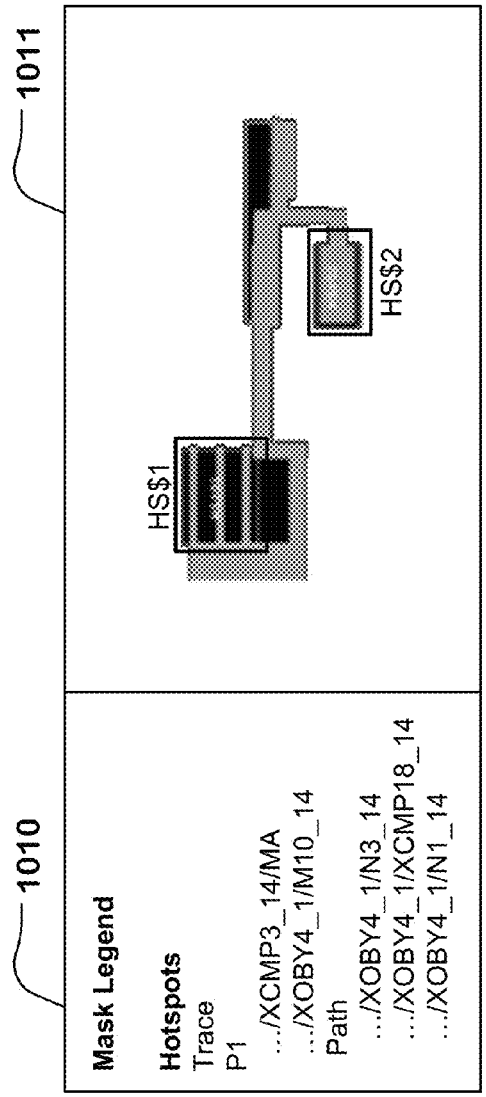
FIGS. 10A and 10B illustrate cross-mapping of an interconnecting path between a first graphic viewer using one of the layout data and the netlist data in the CAD data and a second graphic viewer using another of the layout data and the netlist data in the CAD data in accordance with some embodiments.
Figure 10B:
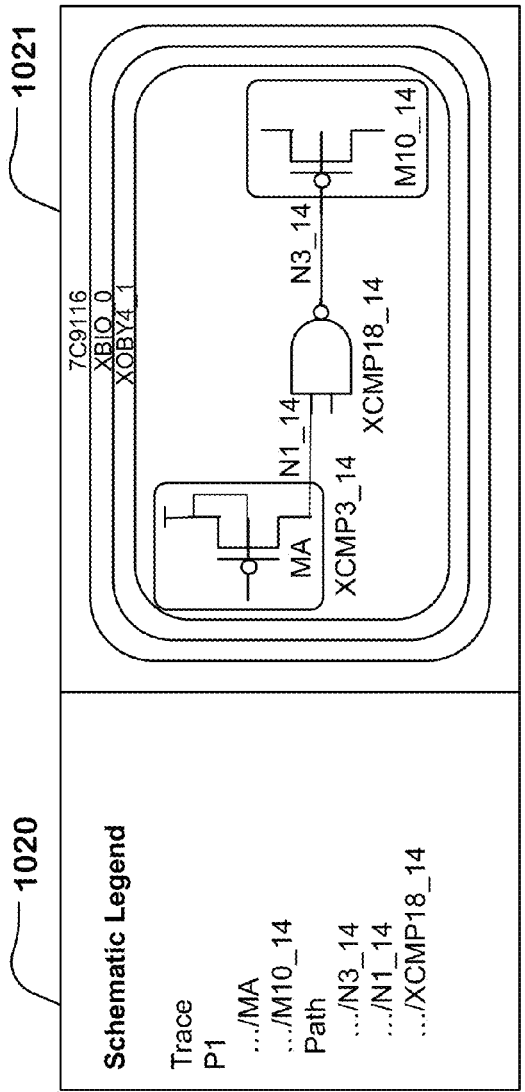

FIGS. 10A and 10B illustrate cross-mapping of an interconnecting path between first graphic viewer using one of the layout data and the netlist data in the CAD data and a second graphic viewer using another of the layout data and the netlist data in the CAD data in accordance with some embodiments. An interconnecting path is between devices overlapping emission sites, and can include a direct wire connection or indirect devices such as transmission gates, buffers and inverters. For instance, the first graphic viewer can be a mask viewer using the layout data, the second graphic viewer can be a schematic viewer using the netlist data, and cross-mapping between a mask viewer and a schematic viewer can use layout versus schematics data (LVS). In the example of FIGS. 10A and 10B, emission sites are referred to as hotspots.

An interconnecting path between devices overlapping emission sites can be selected in a first graphic viewer (FIG. 10A) using one of the layout data and the netlist data in the CAD data. The interconnecting path can be cross-mapped to a second graphic viewer (FIG. 10B) using another of the layout data and the netlist data in the CAD data. The interconnecting path can then be displayed in the second graphic viewer.

FIG. 10A illustrates an example first graphic viewer 1011 and a first legend 1010 for the first graphic viewer. In the first graphic viewer, hotspots HS$1 and HS$2 over the layout of an IC design are selected. The first legend lists a driver device ". . . /XCMP3_14/MA" corresponding to one of the hotspots HS$1 and HS$2, and a receiver device ". . . /XOBY4_1/M10_14" corresponding to another of the hotspots HS$1 and HS$2. An interconnecting path in the legend includes a group of all the devices and nets of the corresponding path. In this example, a path in the legend lists nets (". . . /XOBY4_1/N3_14", ". . . /XOBY4_1/N1_14") and a device (". . . /XOBY4_2/XCMP18_14") between the driver device and receiver device. Those devices and nets in the interconnecting path are cross-mapped to the second graphic viewer shown in FIG. 10B.

FIG. 10B includes an example second graphic viewer 1021 and a second legend 1020 for the second graphic viewer. The second legend lists devices and nets cross-mapped from the first graphic viewer as shown in FIG. 10A. The second graphic viewer shows a hierarchy of devices, e.g. "7C9116", "XBIO_0", and "XOBY4_1", from higher level to lower level of devices. A device "XOBY4_1" includes leaf level devices "MA", "XCMP18_14" and "M10_14". A driver device ". . . /XCMP3_14/MA", and a receiver device ". . . /XOBY4_1/M10_14" as listed in the first legend for the first graphic viewer shown in FIG. 10A are cross-mapped into the second graphic viewer shown in FIG. 10B. Nets ". . . /XOBY4_1/N3_14" and ". . . /XOBY4_1/N1_14" and a device ". . . /XOBY4_2/XCMP18_14" as listed in the first legend for the first graphic viewer shown in FIG. 10A are cross-mapped into the second graphic viewer in the device "XOBY4_1", as shown in FIG. 10B.

FIG. 11 illustrates an example set of processes 1100 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1110 with information supplied by a designer, information which is transformed to create an article of manufacture that uses a set of EDA processes 1112. When the design is finalized, the design is taped-out 1134, which is when artwork (e.g., geometric patterns) for the integrated circuit is sent to a fabrication facility to manufacture the mask set, which is then used to manufacture the integrated circuit. After tape-out, a semiconductor die is fabricated 1136 and packaging and assembly processes 1138 are performed to produce the finished integrated circuit 1140. For fault localization in failure analysis, photon emission analysis 1142 is done on the finished integrated circuit 1140, and correlation to CAD data (layout) 1144 is performed, according to the present technology as described herein.

Device failure can be any non-conformance of the device to its electrical and/or mechanical specifications. Device failure can be due to IC design issues or due to process and/or manufacturing issues. Depending on the result of failure analysis, device failure can be corrected in the IC design or in the process and/or manufacturing. Using the present technology, a failure analysis engineer can perform a failure analysis task in about 30 minutes to one hour, while in comparison, a similar failure analysis task would take a few months using other methods. Using the present technology, the turn-around time in the cycle of failure analysis and corrective action on the failure in the device can be much accelerated.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 11. The processes described by be enabled by EDA products (or tools).

During system design 1114, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1116, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1118, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1120, the netlist is checked for compliance with timing constraints and for correspondence with the HDL code. During design planning 1122, an overall floor plan for the integrated circuit is constructed and analyzed for timing and top-level routing.

During layout or physical implementation 1124, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1126, the circuit function is verified at the layout level, which permits refinement of the layout design. During physical verification 1128, the layout design is checked to ensure that manufacturing constraints are correct, such as DRC constraints, electrical constraints, lithographic constraints, and that circuitry function matches the HDL design specification. During resolution enhancement 1130, the geometry of the layout is transformed to improve how the circuit design is manufactured.

During tape-out, data is created to be used (after lithographic enhancements are applied if appropriate) for production of lithography masks. During mask data preparation 1132, the 'tape-out' data is used to produce lithography masks that are used to produce finished integrated circuits.

A storage subsystem of a computer system (such as computer system 1200 of FIG. 12) may be used to store the programs and data structures that are used by some or all of the EDA products described herein, and products used for development of cells for the library and for physical and logical design that use the library.

Figure 12:
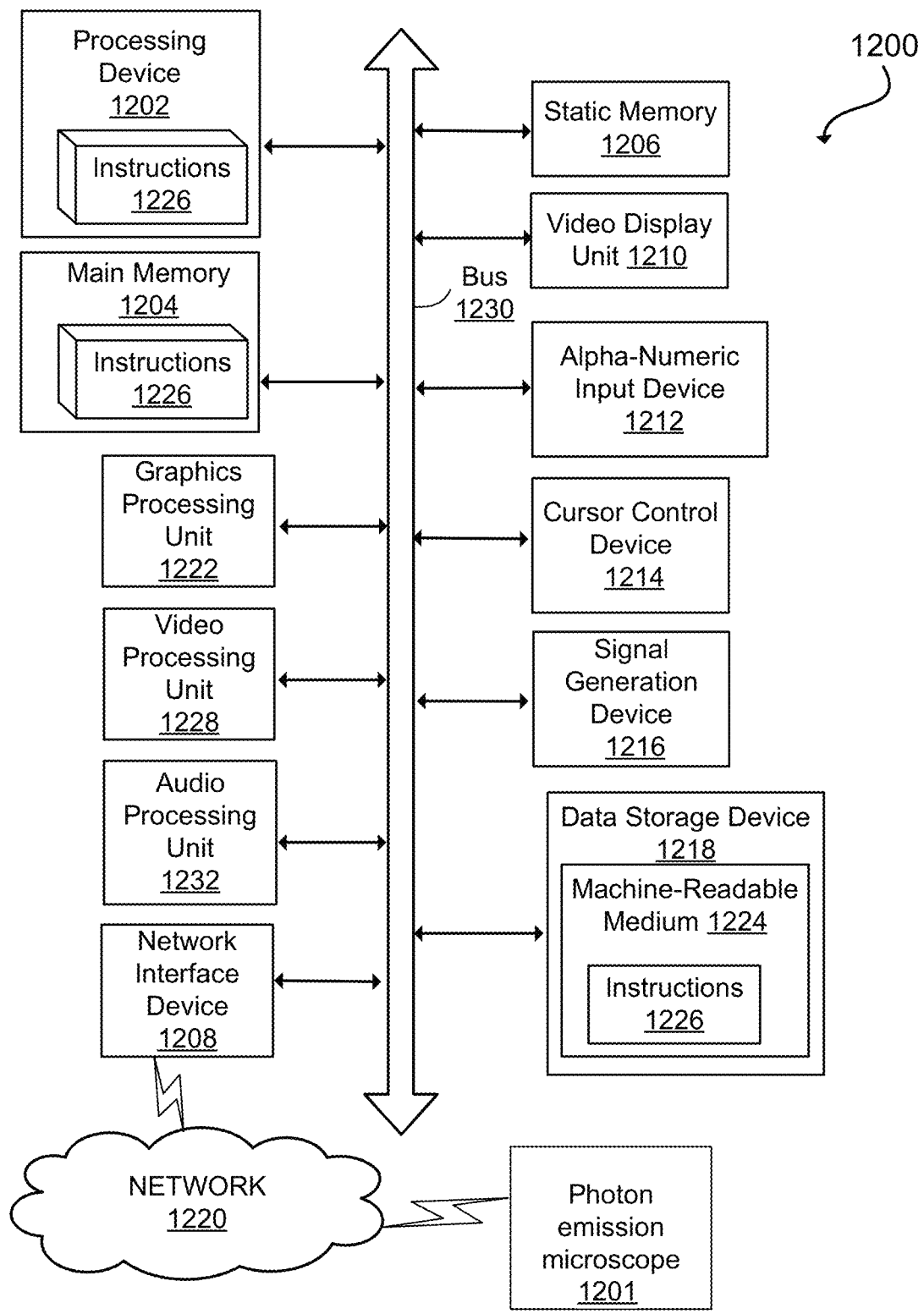
FIG. 12 depicts an abstract diagram of an example computer system in which embodiments of the present disclosure may operate.

FIG. 12 illustrates an example machine of a computer system 1200 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment. A photon emission microscope PEM 1201 of an emission microscopy system can be coupled to the computer system 1200 via network 1220, for taking a PEM image of an integrated circuit for use with the present technology.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM), a static memory 1206 (e.g., flash memory, static random access memory (SRAM), etc.), and a data storage device 1218, which communicate with each other via a bus 1230.

Processing device 1202 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. The processing device 1202 may be configured to execute instructions 1226 for performing the operations and steps described herein.

The computer system 1200 may further include a network interface device 1208 to communicate over the network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), a graphics processing unit 1222, a signal generation device 1216 (e.g., a speaker), graphics processing unit 1222, video processing unit 1228, and audio processing unit 1232.

The data storage device 1218 may include a machine-readable storage medium 1224 (also known as a non-transitory computer-readable medium) on which is stored one or more sets of instructions 1226 or software embodying any one or more of the methodologies or functions described herein. The instructions 1226 may also reside, completely or at least partially, within the main memory 1204 and/or within the processing device 1202 during execution thereof by the computer system 1200, the main memory 1204 and the processing device 1202 also constituting machine-readable storage media.

In some implementations, the instructions 1226 include instructions to implement functionality corresponding to the present disclosure. While the machine-readable storage medium 1224 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1202 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
   capturing a photon emission microscope (PEM) image of an integrated circuit (IC);
   identifying emission sites in the PEM image, the emission sites being associated with a leakage current;
   finding a set of common nets connecting multiple emission sites using at least one or more of layout data obtained from computer-aided design (CAD) data and netlist data obtained from the CAD data;
   identifying, from the at least one or more of the layout data and the netlist data, a net from the set of common nets that connects to a number of emission sites that satisfies a threshold number;
   cross-mapping, by a processor, the identified net identified from the layout data to netlist data in the CAD data;
   identifying, from the netlist data, a particular device having an output pin connected to the identified net; and
   cross-mapping, by a processor, the particular device identified from the netlist data to the layout data,
   wherein the identified net connects at least two devices at the identified emission sites including the particular device.

2. The method of claim 1, the finding of the common nets comprising:
   finding nets overlapping each emission site;
   finding devices connected to each of the found nets;
   adding the found devices to a list of connected devices;
   identifying input pins or output pins of a device in the list of connected devices;
   identifying nets connected to the identified input pins or output pins;
   finding additional devices connected to an identified net;
   determining whether a number of devices connected to the identified net is below a limit;
   in response to determining that the number of devices connected to the identified net is below the limit, determining whether any of the additional devices connected to the identified net is in the list of connected devices; and
   in response to determining that the additional devices connected to the identified net is in the list of connected devices, adding the identified net to a list of valid nets and classifying the identified net as a common net.

3. The method of claim 1, wherein the cross-mapping of the identified net to netlist data in the CAD data, and the cross-mapping of the particular device to the layout data use layout versus schematics data in the CAD data, the layout versus schematics data including a correspondence between devices and connections in the layout data and devices and connections in the netlist data.

4. The method of claim 1, wherein the identifying of the particular device includes searching the netlist data in the CAD data in a forward direction from an input to an output of devices, or in a backward direction from an output to an input of devices.

5. The method of claim 1, wherein a first device, of the at least two devices at the identified emission sites, has a defect causing a light emission on the PEM image, a second device, of the at least two devices at the identified emission sites, emits light on the PEM image as a result of the defect in the first device, and the identified particular device is the first device.

6. The method of claim 1, further comprising identifying the net from the common nets that connects to a greatest number of emission sites.

7. The method of claim 1, wherein the at least two devices at the identified emission sites are connected through one or more levels of transmission gates.

8. The method of claim 1, further comprising:
selecting emission sites identified in the layout data;
finding devices overlapping the emission sites using the netlist data; and
finding interconnecting paths between the devices overlapping the emission sites.

9. The method of claim 1, further comprising:
selecting a pair of elements in the netlist data, the pair of elements being cross-mapped from emission sites in the layout data, a first element in the pair being one of a first device and a first net, a second element in the pair being one of a second device and a second net; and
finding an interconnecting path between the elements in the pair.

10. The method of claim 1, further comprising:
selecting an interconnecting path between devices overlapping emission sites displayed in a first graphic viewer using one of the layout data and the netlist data in the CAD data; and
cross-mapping the interconnecting path to a second graphic viewer using another of the layout data and the netlist data in the CAD data.

11. A system comprising:
a memory storing instructions; and
a processor, coupled with the memory and to execute the instructions, the instructions when executed cause the processor to perform operations comprising:
capturing a photon emission microscope (PEM) image of an integrated circuit (IC);
identifying emission sites in the PEM image, the emission sites being associated with a leakage current;
finding a set of common nets connecting multiple emission sites using at least one or more of layout data obtained from computer-aided design (CAD) data and netlist data obtained from the CAD data;
identifying, from the at least one or more of the layout data and the netlist data, a net from the set of common nets that connects to a number of emission sites that satisfies a threshold number;
cross-mapping, by a processor, the identified net identified from the layout data to netlist data in the CAD data:
identifying, from the netlist data, a particular device having an output pin connected to the identified net; and
cross-mapping, by a processor, the particular device identified from the netlist data to the layout data,
wherein the identified net connects at least two devices at the identified emission sites including the particular device.

12. The system of claim 11, the finding of the common nets comprising:
finding nets overlapping each emission site;
finding devices connected to each of the found nets;
adding the found devices to a list of connected devices;
identifying input pins or output pins of a device in the list of connected devices;
identifying nets connected to the identified input pins or output pins;
finding additional devices connected to an identified net;
determining whether a number of devices connected to the identified net is below a limit;
in response to determining that the number of devices connected to the identified net is below the limit, determining whether any of the additional devices connected to the identified net is in the list of connected devices; and
in response to determining that the additional devices connected to the identified net is in the list of connected devices, adding the identified net to a list of valid nets and classifying the identified net as a common net.

13. The system of claim 11, wherein the identifying of the particular device includes searching the netlist data in the CAD data in a forward direction from an input to an output of devices, or in a backward direction from an output to an input of devices.

14. The system of claim 11, wherein a first device, of the at least two devices at the identified emission sites, has a defect causing a light emission on the PEM image, a second device, of the at least two devices at the identified emission sites, emits light on the PEM image as a result of the defect in the first device, and the identified particular device is the first device.

15. The system of claim 11, wherein the at least two devices at the identified emission sites are connected through one or more levels of transmission gates.

16. A non-transitory computer readable medium comprising stored instructions, which when executed by a processor, cause the processor to perform operations comprising:
capturing a photon emission microscope (PEM) image of an integrated circuit (IC);
identifying emission sites in the PEM image, the emission sites being associated with a leakage current;
finding a set of common nets connecting multiple emission sites using at least one or more of layout data obtained from computer-aided design (CAD) data and netlist data obtained from the CAD data;
identifying, from the at least one or more of the layout data and the netlist data, a net from the set of common nets that connects to a number of emission sites that satisfies a threshold number;
cross-mapping, by a processor, the identified net identified from the layout data to netlist data in the CAD data;
identifying, from the netlist data, a particular device having an output pin connected to the identified net; and
cross-mapping, by a processor, the particular device identified from the netlist data to the layout data,
wherein the identified net connects at least two devices at the identified emission sites including the particular device.

17. The non-transitory computer readable medium of claim 16, the finding of the common nets comprising:
finding nets overlapping each emission site;
finding devices connected to each of the found nets;
adding the found devices to a list of connected devices;
identifying input pins or output pins of a device in the list of connected devices:
identifying nets connected to the identified input pins or output pins;
finding additional devices connected to an identified net;
determining whether a number of devices connected to the identified net is below a limit;
in response to determining that the number of devices connected to the identified net is below the limit, determining whether any of the additional devices connected to the identified net is in the list of connected devices; and
in response to determining that the additional devices connected to the identified net is in the list of connected devices, adding the identified net to a list of valid nets and classifying the identified net as a common net.

18. The non-transitory computer readable medium of claim 16, wherein the identifying of the particular device includes searching the netlist data in the CAD data in a forward direction from an input to an output of devices, or in a backward direction from an output to an input of devices.

19. The non-transitory computer readable medium of claim 16, wherein a first device, of the at least two devices at the identified emission sites, has a defect causing a light emission on the PEM image, a second device, of the at least two devices at the identified emission sites, emits light on the PEM image as a result of the defect in the first device, and the identified particular device is the first device.

20. The non-transitory computer readable medium of claim 16, wherein the at least two devices at the identified emission sites are connected through one or more levels of transmission gates.

\* \* \* \* \*